United States Patent
Rosko et al.

(10) Patent No.: US 10,697,628 B2
(45) Date of Patent: Jun. 30, 2020

(54) FAUCET ILLUMINATION DEVICE

(71) Applicant: Delta Faucet Company, Indianapolis, IN (US)

(72) Inventors: Michael Scot Rosko, Greenwood, IN (US); Joel D. Sawaski, Indianapolis, IN (US)

(73) Assignee: Delta Faucet Company, Indianapolis, IN (US)

( * ) Notice: Subject to any disclaimer, the term of this patent is extended or adjusted under 35 U.S.C. 154(b) by 0 days.

(21) Appl. No.: 15/958,414

(22) Filed: Apr. 20, 2018

(65) Prior Publication Data
US 2018/0306429 A1    Oct. 25, 2018

Related U.S. Application Data

(60) Provisional application No. 62/490,008, filed on Apr. 25, 2017.

(51) Int. Cl.
| | | |
|---|---|---|
| H01B 3/00 | (2006.01) | |
| E03C 1/02 | (2006.01) | |
| F21V 33/00 | (2006.01) | |
| F21S 10/00 | (2006.01) | |
| B05B 1/18 | (2006.01) | |
| F21S 9/04 | (2006.01) | |
| B05B 1/16 | (2006.01) | |
| E03C 1/04 | (2006.01) | |

(Continued)

(52) U.S. Cl.
CPC .......... *F21V 33/004* (2013.01); *B05B 1/1618* (2013.01); *B05B 1/185* (2013.01); *E03C 1/02* (2013.01); *E03C 1/0404* (2013.01); *F21S 9/046* (2013.01); *F21S 10/002* (2013.01); *F21V 7/0066* (2013.01); *F21V 23/0464* (2013.01); *F21V 23/0471* (2013.01); *B05B 1/18* (2013.01); *E03C 2001/0415* (2013.01); *F21S 10/00* (2013.01); *F21V 23/0442* (2013.01); *F21W 2131/30* (2013.01); *F21Y 2103/33* (2016.08); *F21Y 2115/10* (2016.08); *H05K 1/181* (2013.01); *H05K 2201/10106* (2013.01); *H05K 2201/10287* (2013.01); *H05K 2201/10522* (2013.01)

(58) Field of Classification Search
CPC .......... B05B 1/1618; B05B 1/185; E03C 1/02; E03C 1/0404; F21S 9/046; F21S 10/002; F21V 7/0066
See application file for complete search history.

(56) References Cited

U.S. PATENT DOCUMENTS

| | | |
|---|---|---|
| 2,036,567 A | 4/1936 | Cannon |
| 2,105,632 A | 1/1938 | Bernesseer |

(Continued)

FOREIGN PATENT DOCUMENTS

| | | |
|---|---|---|
| CA | 1135365 A | 11/1982 |
| CN | 2438270 Y | 7/2001 |

(Continued)

*Primary Examiner* — Anabel Ton
(74) *Attorney, Agent, or Firm* — Faegre Drinker Biddle & Reath LLP

(57) ABSTRACT

An illumination device for a faucet includes an opaque base supported above a translucent diffuser. A plurality of light emitters is supported by a substrate intermediate the base and the diffuser, wherein light from the light emitters is transmitted through the diffuser and outwardly to provide a display of substantially uniform light.

32 Claims, 15 Drawing Sheets

(51) Int. Cl.
*F21V 7/00* (2006.01)
*F21V 23/04* (2006.01)
*F21Y 115/10* (2016.01)
*F21Y 103/33* (2016.01)
*F21W 131/30* (2006.01)
*H05K 1/18* (2006.01)

(56) References Cited

U.S. PATENT DOCUMENTS

| | | |
|---|---|---|
| 2,274,893 A | 3/1942 | Freedman |
| 2,598,357 A | 5/1952 | Coleman |
| 2,631,393 A | 3/1953 | Hetherington |
| 3,334,745 A | 8/1967 | Burgess et al. |
| 3,810,250 A | 5/1974 | McGregor |
| 3,812,340 A | 5/1974 | Brandt |
| 3,998,240 A | 12/1976 | Liautaud |
| 4,037,624 A | 7/1977 | Turner et al. |
| 4,088,880 A | 5/1978 | Walsh |
| 4,186,761 A | 2/1980 | Guarnieri |
| 4,241,868 A | 12/1980 | Perkins |
| 4,268,893 A | 5/1981 | Harrigan |
| 4,305,117 A | 12/1981 | Evans |
| 4,353,056 A | 10/1982 | Tsikos |
| 4,549,250 A | 10/1985 | Spector |
| 4,564,889 A | 1/1986 | Bolson |
| 4,616,298 A | 10/1986 | Bolson |
| 4,623,451 A | 11/1986 | Oliver |
| 4,630,940 A | 12/1986 | Ostertag et al. |
| 4,667,987 A | 5/1987 | Knebel |
| 4,744,895 A | 5/1988 | Gales et al. |
| 4,749,126 A | 6/1988 | Kessener et al. |
| 4,762,611 A | 8/1988 | Schipper |
| 4,849,098 A | 7/1989 | Wilcock et al. |
| 4,854,498 A | 8/1989 | Stayton |
| 4,856,121 A | 8/1989 | Traylor |
| 4,885,081 A | 12/1989 | Oliver |
| 4,894,647 A | 1/1990 | Walden, Jr. et al. |
| 4,901,922 A | 2/1990 | Kessener et al. |
| 4,955,535 A | 9/1990 | Tsutsui et al. |
| 4,994,792 A | 2/1991 | Ziegler, Jr. |
| 4,998,673 A | 3/1991 | Pilolla |
| 5,003,648 A | 4/1991 | Anderson |
| 5,041,950 A | 8/1991 | Tyson |
| 5,095,941 A | 3/1992 | Betz |
| 5,160,197 A | 11/1992 | Klose |
| 5,165,777 A | 11/1992 | Kira |
| 5,184,642 A | 2/1993 | Powell |
| 5,195,819 A | 3/1993 | Chaut et al. |
| 5,220,488 A | 6/1993 | Denes |
| 5,224,509 A | 7/1993 | Tanaka et al. |
| 5,232,008 A | 8/1993 | Jeffress et al. |
| 5,263,209 A | 11/1993 | Pattee |
| 5,276,595 A | 1/1994 | Patrie |
| 5,276,600 A | 1/1994 | Takase et al. |
| 5,291,378 A | 3/1994 | Stone |
| 5,308,287 A | 5/1994 | Gunsing |
| 5,373,427 A | 12/1994 | McLean |
| 5,388,287 A | 2/1995 | Tischler et al. |
| 5,390,092 A | 2/1995 | Lin |
| 5,400,820 A | 3/1995 | Orth |
| 5,491,617 A | 2/1996 | Currie |
| 5,535,779 A | 7/1996 | Huang |
| 5,566,702 A | 10/1996 | Philipp |
| 5,669,417 A | 9/1997 | Lian-Jie |
| 5,683,168 A | 11/1997 | Teig et al. |
| 5,699,833 A | 12/1997 | Tsataros |
| 5,758,688 A | 6/1998 | Hamanaka et al. |
| 5,793,130 A | 8/1998 | Anderson |
| 5,795,053 A | 8/1998 | Pierce |
| 5,858,215 A | 1/1999 | Burchard et al. |
| 5,868,311 A | 2/1999 | Cretu-Petra |
| 5,873,387 A | 2/1999 | Weber et al. |
| 5,873,647 A | 2/1999 | Kurtz et al. |
| 5,890,794 A | 4/1999 | Abtahi et al. |
| 5,891,329 A | 4/1999 | Massholder |
| 5,942,733 A | 8/1999 | Allen et al. |
| 6,003,160 A | 12/1999 | Seidle et al. |
| 6,014,985 A | 1/2000 | Warshawsky |
| 6,021,960 A | 2/2000 | Kehat |
| 6,036,333 A | 3/2000 | Spiller |
| 6,076,741 A | 6/2000 | Dandrel et al. |
| 6,082,407 A | 7/2000 | Paterson et al. |
| 6,126,290 A | 10/2000 | Veigel |
| 6,135,146 A | 10/2000 | Koganezawa et al. |
| 6,202,980 B1 | 3/2001 | Vincent et al. |
| 6,209,153 B1 | 4/2001 | Segien, Jr. |
| 6,231,203 B1 | 5/2001 | Olshausen |
| 6,294,786 B1 | 9/2001 | Marcichow et al. |
| 6,370,712 B1 | 4/2002 | Burns et al. |
| 6,370,965 B1 | 4/2002 | Knapp |
| 6,382,030 B1 | 5/2002 | Kihara et al. |
| 6,385,794 B1 | 5/2002 | Miedzius et al. |
| 6,385,798 B1 | 5/2002 | Burns et al. |
| 6,416,197 B1 | 7/2002 | Chang |
| 6,434,765 B1 | 8/2002 | Burns et al. |
| 6,439,472 B1 | 8/2002 | Lin et al. |
| 6,452,514 B1 | 9/2002 | Philipp |
| 6,478,440 B1 | 11/2002 | Jaworski et al. |
| 6,513,787 B1 | 2/2003 | Jeromson et al. |
| 6,519,790 B2 | 2/2003 | Ko |
| 6,548,192 B2 | 4/2003 | Chen |
| 6,548,193 B2 | 4/2003 | Chen |
| 6,551,722 B2 | 4/2003 | Jonte et al. |
| 6,558,816 B2 | 5/2003 | Chen |
| 6,619,320 B2 | 9/2003 | Parsons |
| 6,637,676 B2 | 10/2003 | Zieger et al. |
| 6,659,124 B2 | 12/2003 | Burns et al. |
| 6,685,890 B1 | 2/2004 | Van Remmen |
| 6,702,451 B1 | 3/2004 | Daane |
| 6,716,345 B2 | 4/2004 | Snyder |
| 6,729,349 B2 | 5/2004 | Brandebusemeyer |
| 6,734,685 B2 | 5/2004 | Rudrich |
| 6,743,532 B1 | 6/2004 | Chen |
| 6,752,517 B2 | 6/2004 | Hildebrand et al. |
| 6,764,775 B2 | 7/2004 | Chen |
| 6,770,376 B2 | 8/2004 | Chen |
| 6,770,384 B2 | 8/2004 | Chen |
| 6,774,584 B2 | 8/2004 | Lys et al. |
| 6,792,629 B2 | 9/2004 | Nelson et al. |
| 6,803,133 B2 | 10/2004 | Chen |
| 6,805,458 B2 | 10/2004 | Schindler et al. |
| 6,874,527 B2 | 4/2005 | Meeder |
| 6,909,101 B2 | 6/2005 | Nishioka |
| 6,962,168 B2 * | 11/2005 | McDaniel ............... E03C 1/055 |
| | | 137/624.11 |
| 7,008,073 B2 | 3/2006 | Stuhlmacher, II |
| 7,017,600 B2 | 3/2006 | Klein |
| 7,104,519 B2 | 9/2006 | O'Maley et al. |
| 7,150,293 B2 * | 12/2006 | Jonte ....................... E03C 1/057 |
| | | 137/613 |
| 7,174,577 B2 | 2/2007 | Jost et al. |
| 7,175,158 B2 | 2/2007 | Thomas |
| 7,201,175 B2 | 4/2007 | DeBoer et al. |
| 7,228,874 B2 | 6/2007 | Bolderheij et al. |
| 7,258,781 B2 | 8/2007 | Warren et al. |
| 7,303,300 B2 | 12/2007 | Dowling et al. |
| 7,344,902 B2 | 3/2008 | Basin et al. |
| 7,377,661 B2 | 5/2008 | Douglass |
| 7,404,649 B2 | 7/2008 | Gosis et al. |
| 7,406,980 B2 | 8/2008 | Pinette |
| 7,415,991 B2 | 8/2008 | Meehan et al. |
| 7,434,960 B2 | 10/2008 | Stuhlmacher, II et al. |
| 7,467,874 B2 | 12/2008 | Gautschi et al. |
| 7,518,381 B2 | 4/2009 | Lamborghini et al. |
| 7,537,023 B2 | 5/2009 | Marty et al. |
| 7,628,512 B2 | 12/2009 | Netzel, Sr. et al. |
| 7,631,372 B2 | 12/2009 | Marty et al. |
| 7,633,055 B2 | 12/2009 | Nail et al. |
| 7,666,497 B2 | 2/2010 | Takatsuki et al. |
| 7,690,395 B2 * | 4/2010 | Jonte ....................... E03C 1/05 |
| | | 137/551 |
| 7,717,133 B2 | 5/2010 | Pinette et al. |
| 7,721,761 B2 | 5/2010 | Thomas |
| 7,743,788 B2 | 6/2010 | Schmitt et al. |

(56) References Cited

U.S. PATENT DOCUMENTS

| | | |
|---|---|---|
| 7,748,409 B2 | 7/2010 | Pinette et al. |
| 7,766,043 B2 | 8/2010 | Thomas et al. |
| 7,793,677 B2 | 9/2010 | Pinette |
| 7,806,141 B2 | 10/2010 | Marty et al. |
| 7,819,137 B2 | 10/2010 | Nelson et al. |
| 7,819,541 B2 | 10/2010 | Kunkel |
| 7,850,323 B2 | 12/2010 | Keiper et al. |
| 7,883,261 B2 | 2/2011 | Yu |
| 7,896,025 B2 | 3/2011 | Hanson |
| 8,028,355 B2 | 10/2011 | Reeder et al. |
| 8,127,782 B2 | 3/2012 | Jonte et al. |
| 8,162,236 B2 | 4/2012 | Rodenbeck et al. |
| 8,198,979 B2 | 6/2012 | Haag et al. |
| 8,277,070 B1 | 10/2012 | Schwarz |
| 9,057,184 B2 | 6/2015 | Meehan et al. |
| D751,172 S | 3/2016 | Bahler |
| 9,333,698 B2 | 5/2016 | DeVries et al. |
| D763,408 S | 8/2016 | Garland |
| 9,976,291 B2 | 5/2018 | Sawaski et al. |
| 10,287,760 B2 | 5/2019 | Sawaski et al. |
| 10,393,363 B2 | 8/2019 | Weaver et al. |
| 2002/0150798 A1 | 10/2002 | Jonte et al. |
| 2002/0171378 A1 | 11/2002 | Morgan et al. |
| 2003/0147238 A1 | 8/2003 | Allen et al. |
| 2003/0213062 A1 | 11/2003 | Honda et al. |
| 2003/0223222 A1 | 12/2003 | Yu |
| 2004/0032749 A1 | 2/2004 | Schindler et al. |
| 2004/0179351 A1 | 9/2004 | Patterson |
| 2004/0258567 A1 | 12/2004 | Kokin et al. |
| 2005/0257628 A1 | 11/2005 | Nikaido et al. |
| 2005/0279676 A1 | 12/2005 | Izzy et al. |
| 2006/0117476 A1 | 6/2006 | Kunkel |
| 2006/0124183 A1 | 6/2006 | Kuo |
| 2006/0152917 A1 | 7/2006 | Stuhlmacher et al. |
| 2006/0157127 A1 | 7/2006 | Bors et al. |
| 2006/0157128 A1 | 7/2006 | Frackowiak et al. |
| 2006/0175437 A1 | 8/2006 | Gross |
| 2006/0283511 A1 | 12/2006 | Nelson |
| 2007/0031624 A1 | 2/2007 | Brosius |
| 2007/0069418 A1 | 3/2007 | Liao et al. |
| 2007/0121326 A1 | 5/2007 | Nail et al. |
| 2007/0137714 A1 | 6/2007 | Meehan et al. |
| 2007/0241977 A1 | 10/2007 | Vance |
| 2007/0273394 A1 | 11/2007 | Tanner et al. |
| 2008/0099091 A1 | 5/2008 | Benstead |
| 2008/0109956 A1 | 5/2008 | Bayley et al. |
| 2008/0178935 A1 | 7/2008 | Thomas |
| 2008/0178954 A1 | 7/2008 | Pinette et al. |
| 2008/0185060 A1 | 8/2008 | Nelson |
| 2008/0257706 A1 | 10/2008 | Haag |
| 2008/0271238 A1 | 11/2008 | Reeder et al. |
| 2008/0308165 A1 | 12/2008 | Meehan et al. |
| 2009/0000026 A1 | 1/2009 | Hanson |
| 2009/0039176 A1 | 2/2009 | Davidson et al. |
| 2009/0161342 A1 | 6/2009 | Hou et al. |
| 2009/0276954 A1 | 11/2009 | Davidson |
| 2010/0093267 A1 | 4/2010 | Hogh et al. |
| 2010/0117660 A1 | 5/2010 | Douglas et al. |
| 2010/0125946 A1 | 5/2010 | Meisner et al. |
| 2010/0180375 A1 | 7/2010 | Meehan et al. |
| 2010/0213398 A1 | 8/2010 | Brunner et al. |
| 2010/0242274 A1 | 9/2010 | Rosenfeld et al. |
| 2011/0003144 A1 | 1/2011 | Brown et al. |
| 2011/0012378 A1 | 1/2011 | Ueno et al. |
| 2011/0016625 A1 | 1/2011 | Marty et al. |
| 2011/0051877 A1* | 3/2011 | Ahlfeld ................. G21C 1/026 376/256 |
| 2011/0187957 A1 | 8/2011 | Kim et al. |
| 2011/0209781 A1 | 9/2011 | Fath |
| 2011/0216526 A1 | 9/2011 | Li |
| 2012/0188179 A1 | 7/2012 | Karlsson |
| 2012/0200517 A1 | 8/2012 | Nikolovski |
| 2012/0223805 A1 | 9/2012 | Haag et al. |
| 2012/0227841 A1 | 9/2012 | Peteri |
| 2013/0098489 A1 | 4/2013 | Meehan et al. |
| 2013/0276911 A1 | 10/2013 | Meehan et al. |
| 2013/0299608 A1 | 11/2013 | Spangler et al. |
| 2014/0198491 A1 | 7/2014 | Schlueter |
| 2014/0261767 A1* | 9/2014 | DeVries ................. B29C 51/12 137/356 |
| 2015/0040997 A1 | 2/2015 | Blake et al. |
| 2015/0202642 A1 | 7/2015 | Isley |
| 2015/0292693 A1 | 10/2015 | Franke |
| 2016/0024766 A1 | 1/2016 | Sawaski et al. |
| 2016/0091184 A1* | 3/2016 | Ng ............................ A45F 3/20 362/101 |
| 2016/0161086 A1* | 6/2016 | Kang ..................... F21V 7/0066 |
| 2016/0215860 A1* | 7/2016 | Thompson ............ F16H 7/1281 |
| 2016/0290532 A1* | 10/2016 | Defrance .............. F16L 3/1075 |
| 2018/0128439 A1 | 5/2018 | Bruls et al. |
| 2018/0266089 A1 | 9/2018 | Sawaski et al. |
| 2018/0306429 A1* | 10/2018 | Rosko ..................... B05B 1/185 |
| 2018/0306430 A1 | 10/2018 | Weaver et al. |

FOREIGN PATENT DOCUMENTS

| | | |
|---|---|---|
| CN | 2488597 Y | 5/2002 |
| CN | 201250949 Y | 6/2009 |
| CN | 201354883 Y | 12/2009 |
| CN | 201407414 Y | 2/2010 |
| DE | 3135861 A1 | 3/1983 |
| DE | 3508680 A1 | 9/1986 |
| DE | 9109457 U1 | 10/1991 |
| DE | 4340933 A1 | 6/1995 |
| DE | 19638788 A1 | 3/1998 |
| DE | 19639802 A1 | 4/1998 |
| DE | 19822966 A1 | 12/1999 |
| DE | 10042722 A1 | 3/2002 |
| DE | 10128688 A1 | 3/2002 |
| DE | 10144602 A1 | 4/2003 |
| DE | 102013002236 A1 | 8/2014 |
| EP | 0679770 A2 | 11/1995 |
| EP | 0961067 A2 | 12/1999 |
| EP | 1022396 A2 | 7/2000 |
| GB | 2077470 A | 12/1981 |
| GB | 2281797 A | 3/1995 |
| GB | 2288974 A | 11/1995 |
| GB | 2288974 B | 9/1998 |
| GB | 2323696 A | 9/1998 |
| JP | H0893017 A | 4/1996 |
| JP | H10332490 A | 12/1998 |
| JP | 2001012646 A | 1/2001 |
| JP | 2001120448 A | 5/2001 |
| JP | 2001123485 A | 5/2001 |
| JP | 2001123486 A | 5/2001 |
| JP | 2001146774 A | 5/2001 |
| JP | 2001182109 A | 7/2001 |
| JP | 2001189106 A | 7/2001 |
| JP | 2001252647 A | 9/2001 |
| JP | 2001295344 A | 10/2001 |
| JP | 2001323531 A | 11/2001 |
| JP | 2002042546 A | 2/2002 |
| JP | 2002242245 A | 8/2002 |
| JP | 2002242246 A | 8/2002 |
| JP | 2002266393 A | 9/2002 |
| JP | 2002266394 A | 9/2002 |
| JP | 2002294775 A | 10/2002 |
| JP | 2002364035 A | 12/2002 |
| JP | 2003027537 A | 1/2003 |
| JP | 2003027543 A | 1/2003 |
| JP | 2003056027 A | 2/2003 |
| JP | 2003064743 A | 3/2003 |
| JP | 2003119854 A | 4/2003 |
| JP | 2003147823 A | 5/2003 |
| JP | 2003171958 A | 6/2003 |
| JP | 2003213745 A | 7/2003 |
| JP | 2003232059 A | 8/2003 |
| JP | 2003293405 A | 10/2003 |
| JP | 2003293406 A | 10/2003 |
| JP | 2004116083 A | 4/2004 |
| WO | WO9112896 A1 | 9/1991 |
| WO | WO1995029300 A1 | 11/1995 |
| WO | WO2000032314 A1 | 6/2000 |
| WO | WO2001034917 A1 | 5/2001 |

(56) References Cited

FOREIGN PATENT DOCUMENTS

| WO | WO2001077577 A1 | 10/2001 |
| WO | WO02061330 A2 | 8/2002 |
| WO | WO 2009/158498 | 12/2009 |
| WO | WO2010120070 A2 | 10/2010 |
| WO | WO2010120070 A3 | 1/2011 |

* cited by examiner

FAUCET ILLUMINATION DEVICE

CROSS-REFERENCE TO RELATED APPLICATION

This application claims priority to U.S. Provisional Patent Application Ser. No. 62/490,008, filed Apr. 25, 2017, the disclosure of which is expressly incorporated herein by reference.

BACKGROUND AND SUMMARY OF THE DISCLOSURE

The present invention relates to fluid delivery devices and, more particularly, to an illumination device for a faucet.

Illumination devices associated with faucets are known. Such illumination devices may include indicator lights for providing a visual indication of a status or a condition of an electronic faucet and/or water flowing from the faucet, and nightlights associated with lavatory faucets. Such illumination devices typically include a single light source, or a plurality of light sources providing for discrete areas of illumination (i.e. "hot spots").

The present disclosure provides for an illumination device associated with a faucet that provides a diffused light source providing a substantially uniform display of light.

According to an illustrative embodiment of the present disclosure, an illumination device for a faucet includes a base formed of an opaque material, the base have an inner wall, an outer wall laterally spaced from the inner wall, an upper wall extending between the inner wall and the outer wall, and a recess defined between the inner wall, the outer wall and the upper wall. A diffuser formed of a translucent material is positioned laterally outwardly from the inner wall of the base and is positioned longitudinally below the outer wall of the base. A substrate is positioned within the recess intermediate the base and the diffuser. A plurality of light emitters is supported by the substrate, and the diffuser is configured to diffuse light from the light emitters laterally outwardly.

According to another illustrative embodiment of the present disclosure, a faucet includes a faucet body, and a base formed of an opaque material, the base including an upper wall supporting the faucet body, and an outer shield extending downwardly from the upper wall. A diffuser is formed of a translucent material, the diffuser being positioned laterally outwardly from the inner wall of the base and positioned longitudinally below the outer wall of the base. A substrate is supported by a lower surface of the upper wall of the base, and a plurality of light emitters is supported by the substrate.

According to a further illustrative embodiment of the present disclosure, a method of providing illumination adjacent a faucet includes the steps of providing an opaque base, providing a translucent diffuser below the base, and supporting a plurality of light emitters by the base. The illustrative method further includes the steps of supporting a faucet component on the base, emitting light from the plurality of light emitters, and diffusing the light through the diffuser to define a substantially uniform display of light.

According to another illustrative embodiment of the present disclosure, a faucet includes a faucet body, a substrate supported by the faucet body, and at least one light emitter supported by the substrate. A first sensor is configured to detect ambient light and generate a first signal in response to detected light intensity above a predetermined value. A second sensor is configured to be enabled in response to the first signal and, when enabled, to detect the presence of a user and generate a second signal. The at least one light emitter is activated in response to the second signal.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF DRAWINGS

The detailed description of the drawings particularly refers to the accompanying figures, in which.

DETAILED DESCRIPTION OF THE DRAWINGS

Figure 1:
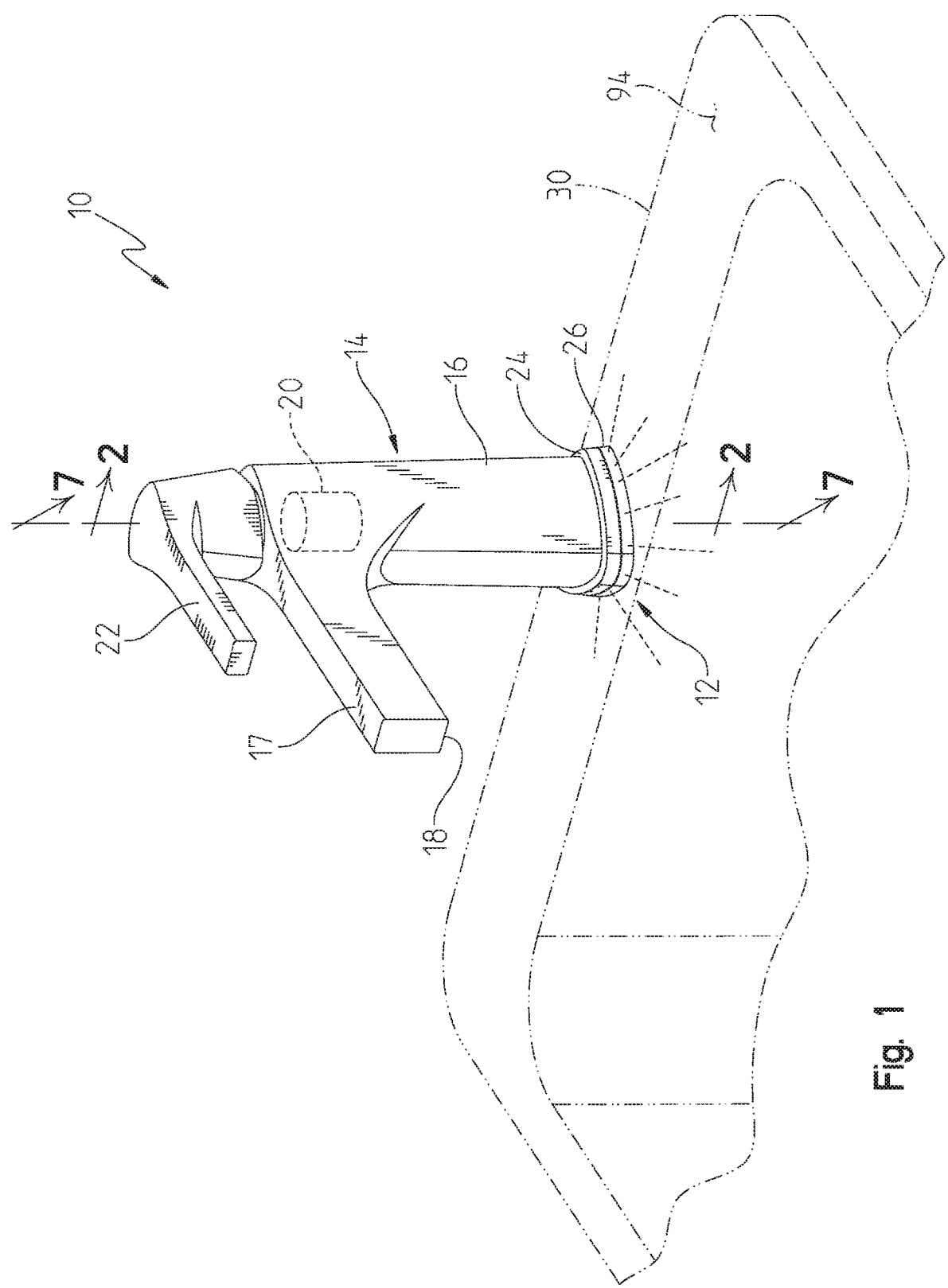
FIG. 1 is a perspective view of an illustrative faucet coupled to a sink deck.

For the purposes of promoting an understanding of the principles of the present disclosure, reference will now be made to the embodiments illustrated in the drawings, which are described herein. The embodiments disclosed herein are not intended to be exhaustive or to limit the invention to the precise form disclosed. Rather, the embodiments are chosen and described so that others skilled in the art may utilize their teachings. Therefore, no limitation of the scope of the claimed invention is thereby intended. The present invention includes any alterations and further modifications of the illustrated devices and described methods and further applications of the principles of the invention which would normally occur to one skilled in the art to which the invention relates.

Referring initially to FIG. 1, an illustrative embodiment faucet 10 includes an illumination device 12 operably coupled to a faucet body, such as a delivery spout 14. Illustratively, the delivery spout 14 includes a base portion or hub 16 and a cantilevered portion 17 supporting a water outlet 18. Illustratively, a conventional mixing valve 20 is supported within the spout 14 to control activation, flow rate and temperature of water discharged through the water outlet 18. Hot and cold water supply tubes 21a and 21b may be fluidly coupled to inlet ports of the mixing valve 20. A water outlet tube 23 (FIG. 3) may couple an outlet port of the mixing valve 20 to the water outlet 18. A manual handle 22 is operably coupled to the mixing valve 20 to control operation thereof.

Figure 2:
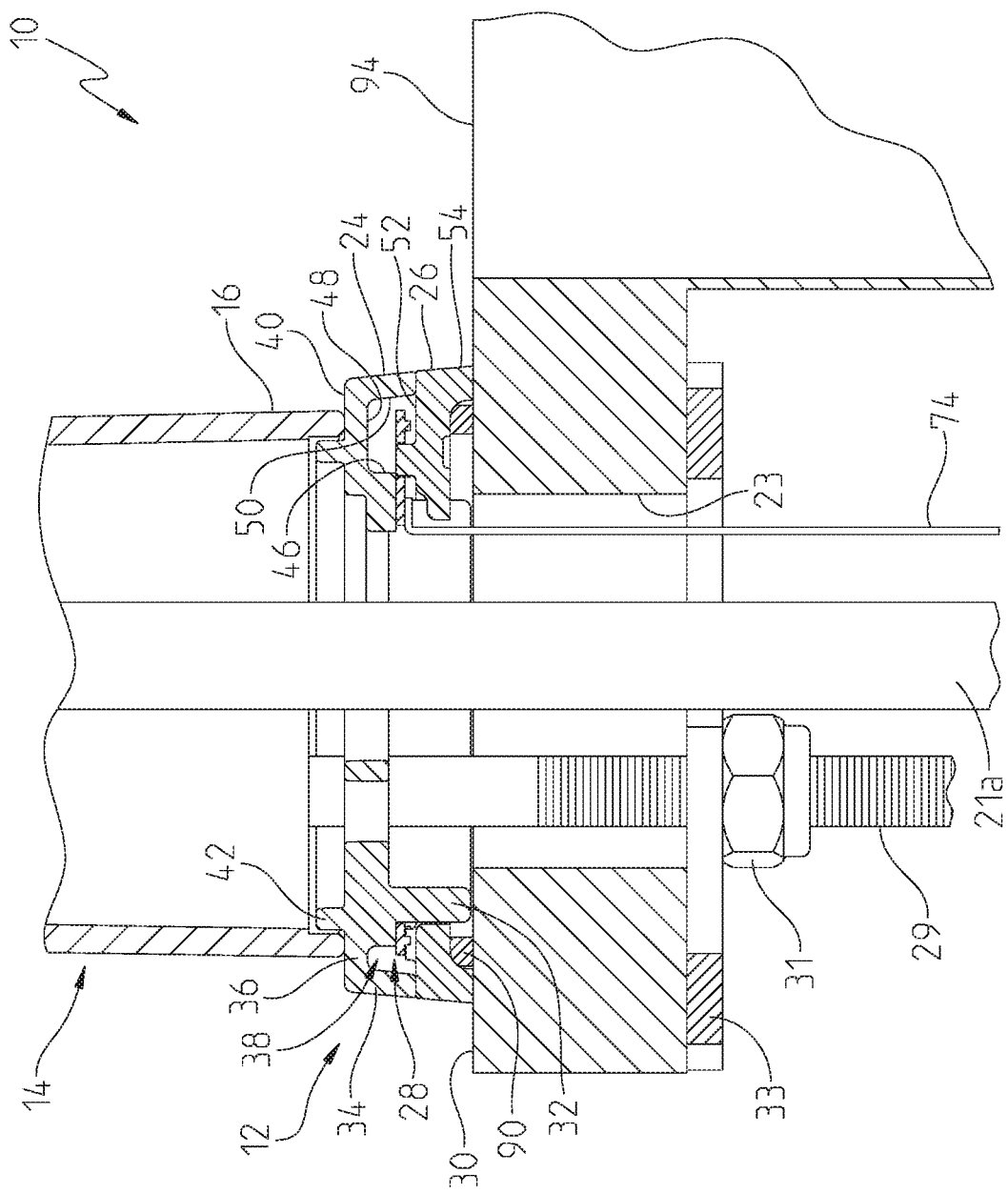
FIG. 2 is a cross-sectional view taken along line 2-2 of FIG. 1.
Figure 3:
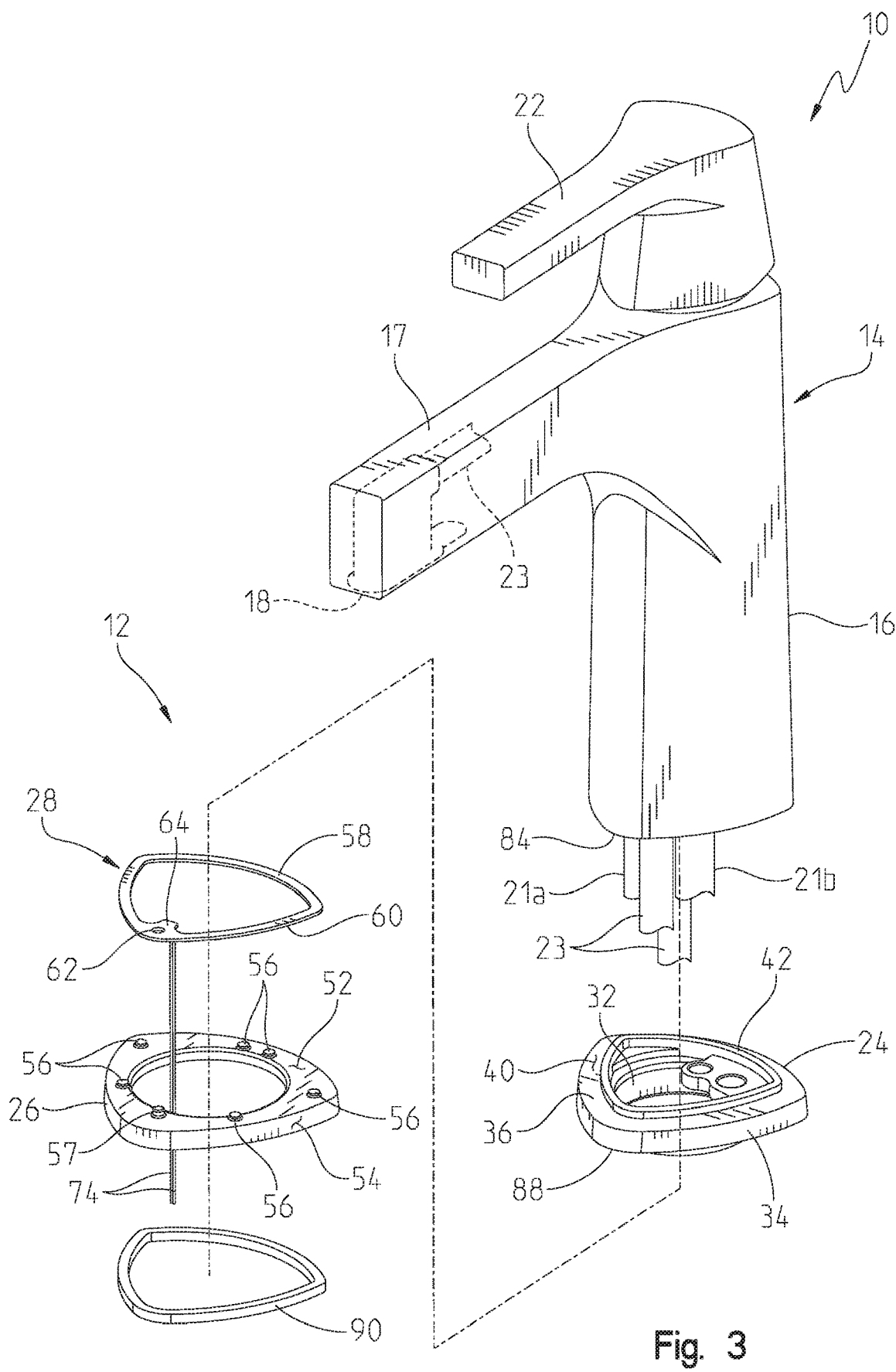
FIG. 3 is a top exploded perspective view of the faucet of FIG. 1.
Figure 4:
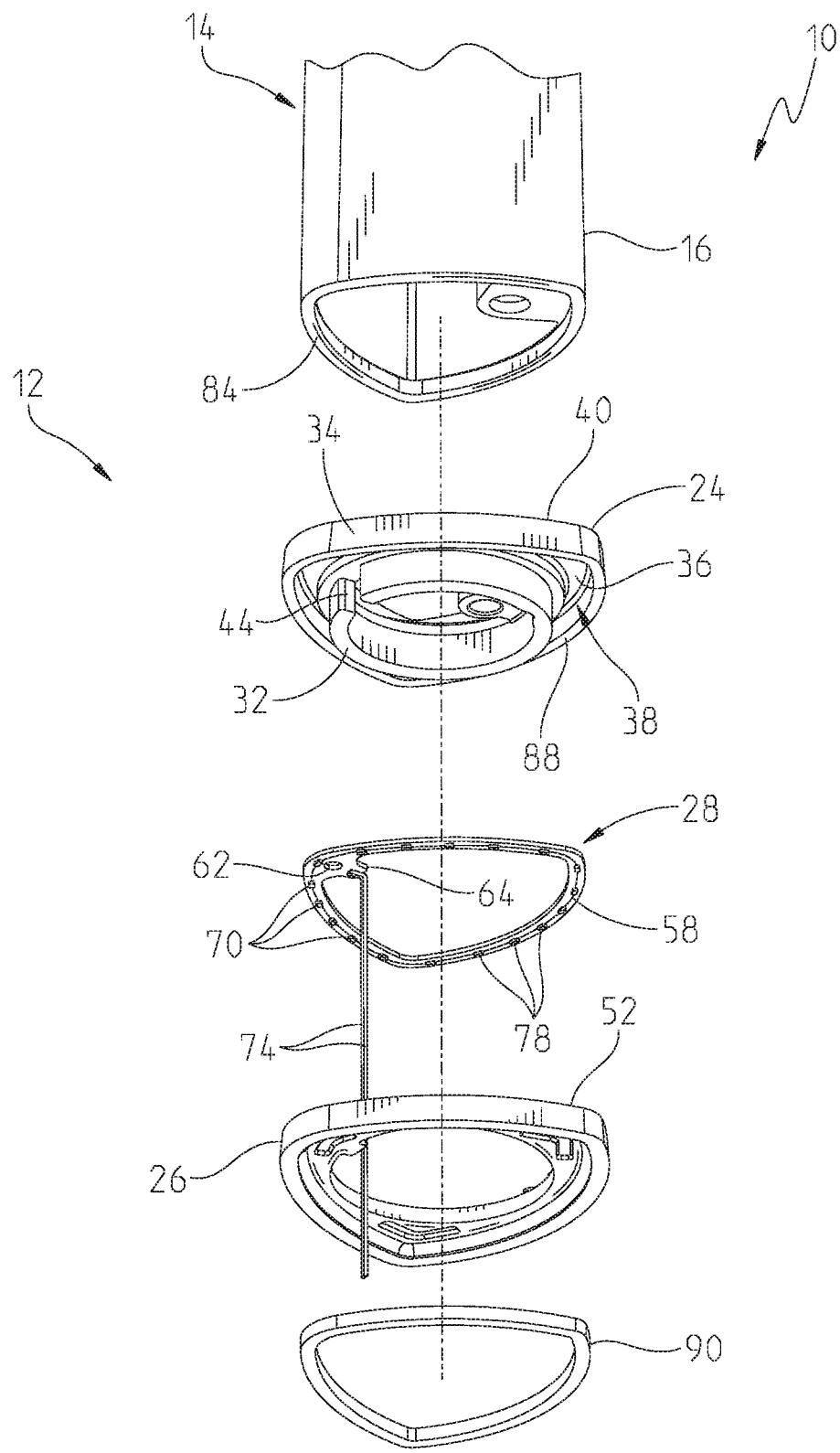
FIG. 4 is a bottom exploded perspective view of the faucet of FIG. 1.
Figure 5:
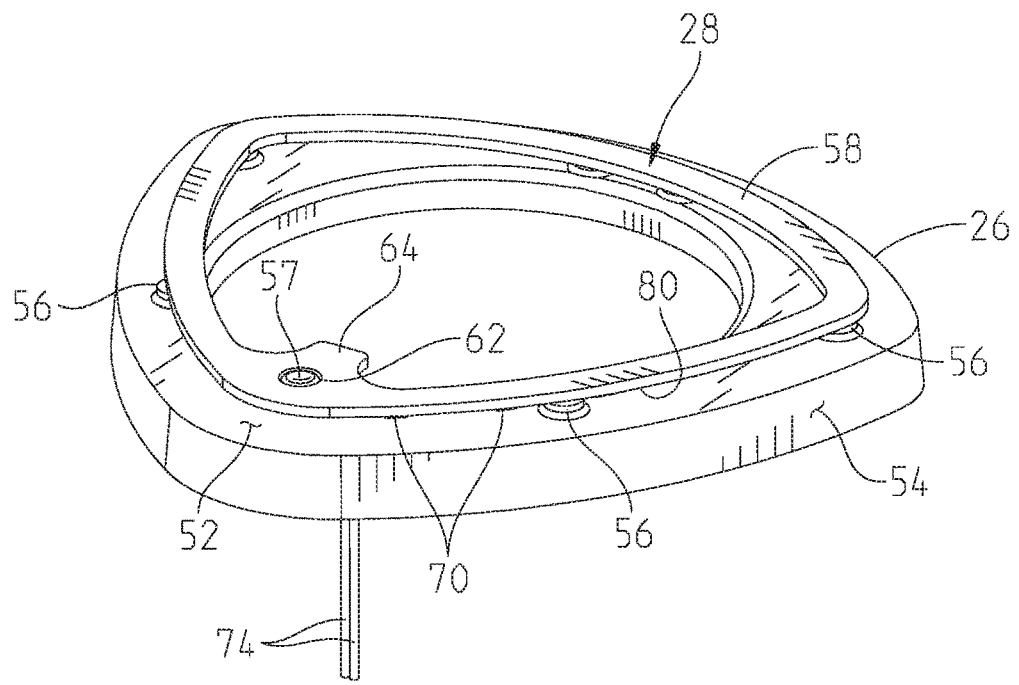
FIG. 5 is a top perspective view of the base and substrate of the faucet of FIG. 1.

With reference to FIGS. 2-4, the illumination device 12 illustratively supports the hub 16 of the delivery spout 14 and is configured to conform to the cross-sectional shape thereof. The illumination device 12 illustratively includes a base 24, a lens or diffuser 26, and a light assembly 28 positioned intermediate the base 24 and the diffuser 26. In an illustrative embodiment, the hub 16 of the delivery spout 14 is supported by the base 24, the base 24 is supported by the diffuser 26, and the diffuser 26 is supported by a mounting deck, such as a sink deck 30. The hot and cold water supply tubes 21a and 21b illustratively extend downwardly through an opening 23 in the sink deck 30. A mounting shank 29 and nut 31 cooperate to secure the spout 14 to the sink deck 30 via a mounting plate 33.

Figure 7:
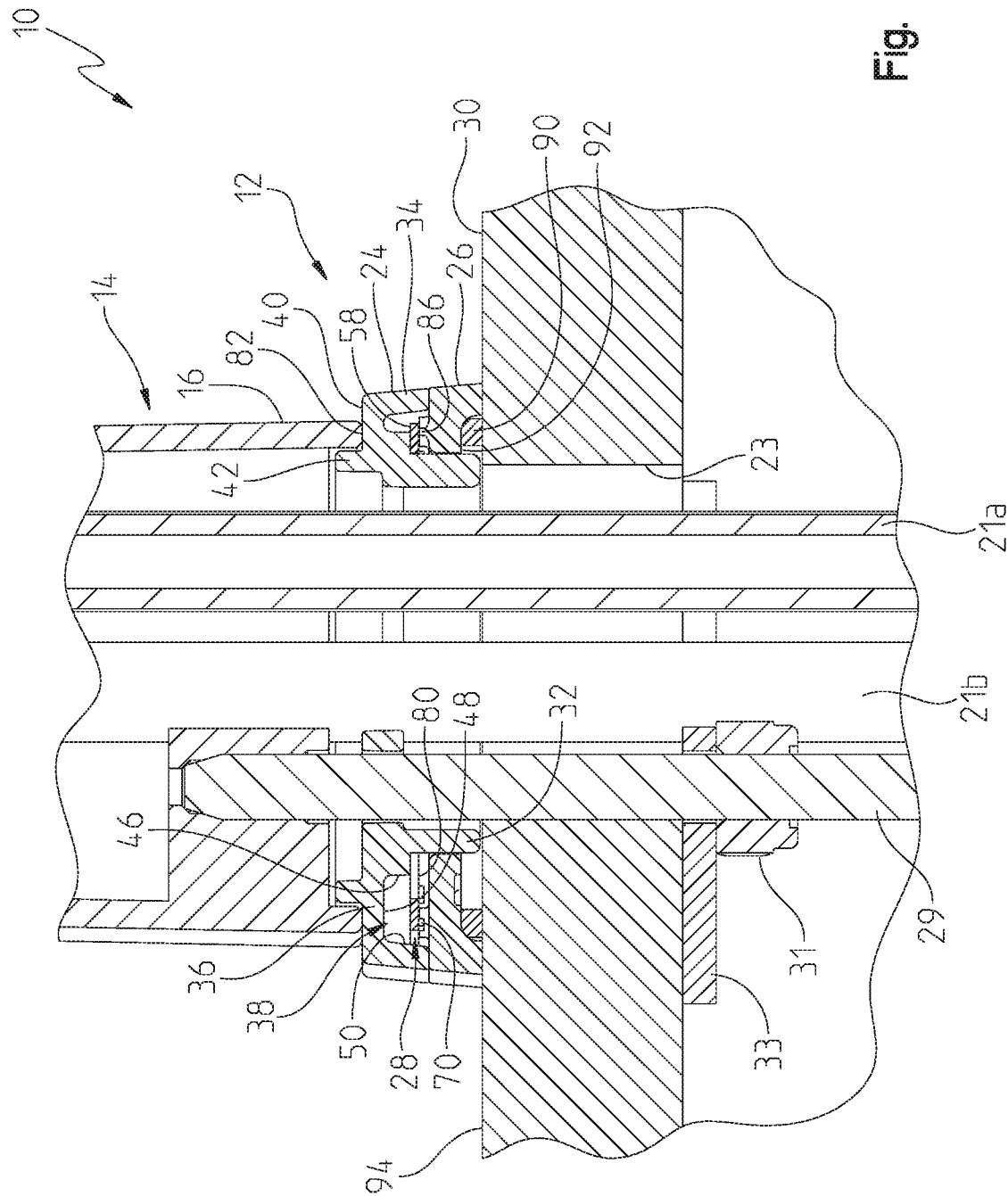
FIG. 7 is a cross-section view taken along line 7-7 of FIG. 1.

With reference to FIGS. 2, 4 and 7, the base 24 illustratively includes an inner wall 32, and an outer wall 34 laterally spaced from the inner wall 32, and an upper wall 36 extending between the inner wall 32 and the outer wall 34. A recess 38 is illustratively defined between the inner wall 32, the outer wall 34 and the upper wall 36. An upper surface 40 of the upper wall 36 illustratively supports the hub 16 of the delivery spout 14. A locator wall 42 may extend upwardly from the upper surface 40 and is configured to be received within the hub 16 of the spout 14. The inner wall 32 is illustratively cylindrical and includes an opening or slot 44 (FIG. 4).

The base 24 is illustratively formed of an opaque material, such as a metal or a chrome plated polymer. Inner surfaces 46, 48, 50 of the base 24 are illustratively reflective to facilitate reflection and diffusion of light from the light assembly 28.

With reference to FIGS. 2-5 and 7, the diffuser 26 is illustratively formed of a translucent material (e.g., a polymer or acrylic) and positioned laterally outwardly from the inner wall 32 of the base 24 and positioned longitudinally below the outer wall 34 of the base 24. The outer surfaces 52 and 54 of the diffuser 26 may be textured to assist in diffusing light from the light assembly 28. Illustratively, a plurality of spacer protrusions 56 extend upwardly from the upper surface 52. Similarly, a retainer protrusion 57 extends upwardly from the upper surface 54.

With reference to FIGS. 3-7, the light assembly 28 illustratively includes a substrate 58 positioned within the recess 38 intermediate the base 24 and the diffuser 26. A lower surface 60 of the substrate 58 is illustratively supported by the spacer protrusions 56 above the upper surface 52 of the diffuser 26. An opening 62 in the substrate 58 illustratively receives the retainer protrusion 57. An inwardly extending tab 64 of the substrate 58 is illustratively received within the slot 44 of the inner wall 32 of the base 24.

Figure 6:
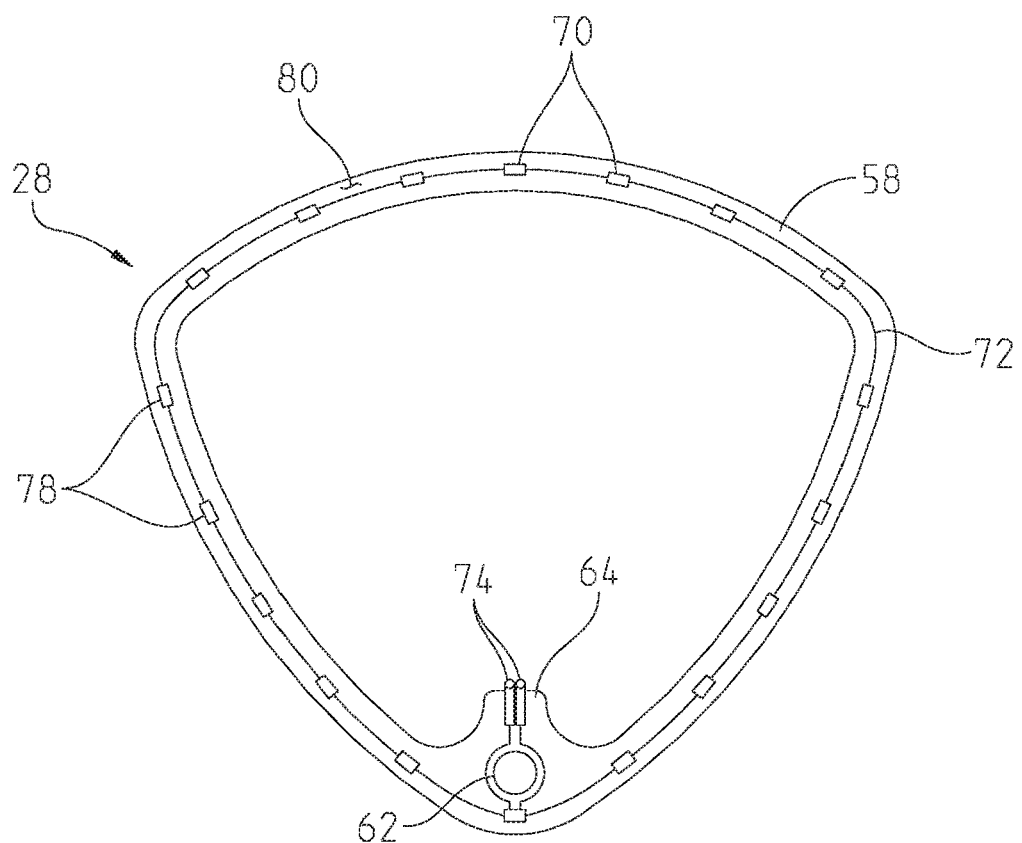
FIG. 6 is a top plan view of the substrate of the faucet of FIG. 1.

Referring further to FIG. 6, a plurality of light emitters 70 are supported by the substrate 58. Illustratively, the substrate 58 comprises a printed circuit board (e.g., a glass reinforced epoxy laminate sheet) including a plurality of electrically conductive traces 72 (e.g., formed of copper) electrically coupled to the plurality to the light emitters 70. Electrical wires 74 are illustratively coupled to the conductive traces 72 and a power supply 76. More particularly, the electrical wires 74 may extend through the opening 23 within the sink deck 30 downwardly to the power supply 76, illustratively batteries.

In a further illustrative embodiment, a light pipe (not shown) may be substituted for the substrate 58 and light emitters 70. More particularly, the light pipe may be positioned within the recess to emit might toward the diffuser 26. The outer wall 34 of the base 24 illustratively defines an outer shield extending downwardly below the light emitters 70 to prevent direct laterally outward transmission of light.

The light emitters 70 are illustratively light emitting diodes (LEDs) 78 configured to direct light longitudinally downwardly toward the diffuser 26. The light emitting diodes 78 are illustratively supported by a lower surface 80 of the substrate 58 and evenly spaced around a closed loop defined by the substrate 58. The light emitting diodes 78 may each be configured to emit visible light of the same color (e.g., white LEDs), or may be configured to emit visible light of different colors (blue/red bi-color LEDs). Alternatively, different light emitting diodes 78 may be configured to emit different colors (e.g., alternating blue and red LEDs).

As shown in FIGS. 3, 4 and 7, a first seal 82 may be defined between a lower surface 84 of the spout 14 and the upper surface 40 of the base 24, and a second seal 86 may be defined between a lower surface 88 of the outer wall 34 of the base 24 and the upper surface 52 of the diffuser 26. Further, an elastomeric gasket 90 may be positioned within a notch or groove 92 formed in the diffuser 26 and an upper surface 94 of the sink deck 30.

The diffuser 26 is configured to diffuse light reflected by the base 24 laterally outwardly. The light emitting diodes 78 are spaced apart to define a continuous loop of continuous light diffused by the diffuser 26.

Figure 8:
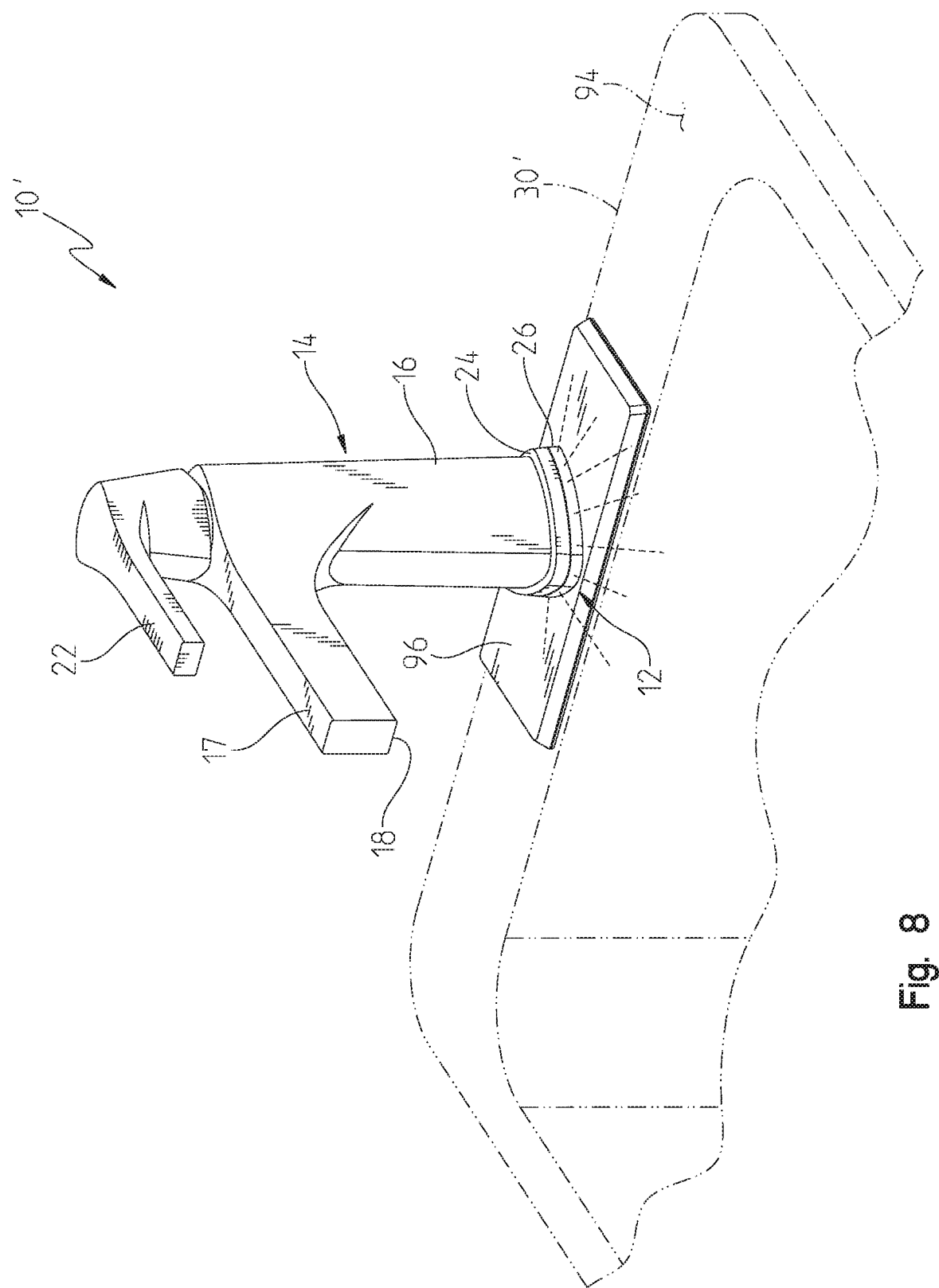
FIG. 8 is a perspective view of a further illustrative faucet including an escutcheon supported by the sink deck.

As shown in a further illustrative faucet 10' of FIG. 8, an escutcheon 96 may be supported below the base 24. The escutcheon 96 may be used, for example, with a sink deck 30' including a three-hole mounting configuration.

Figure 9:
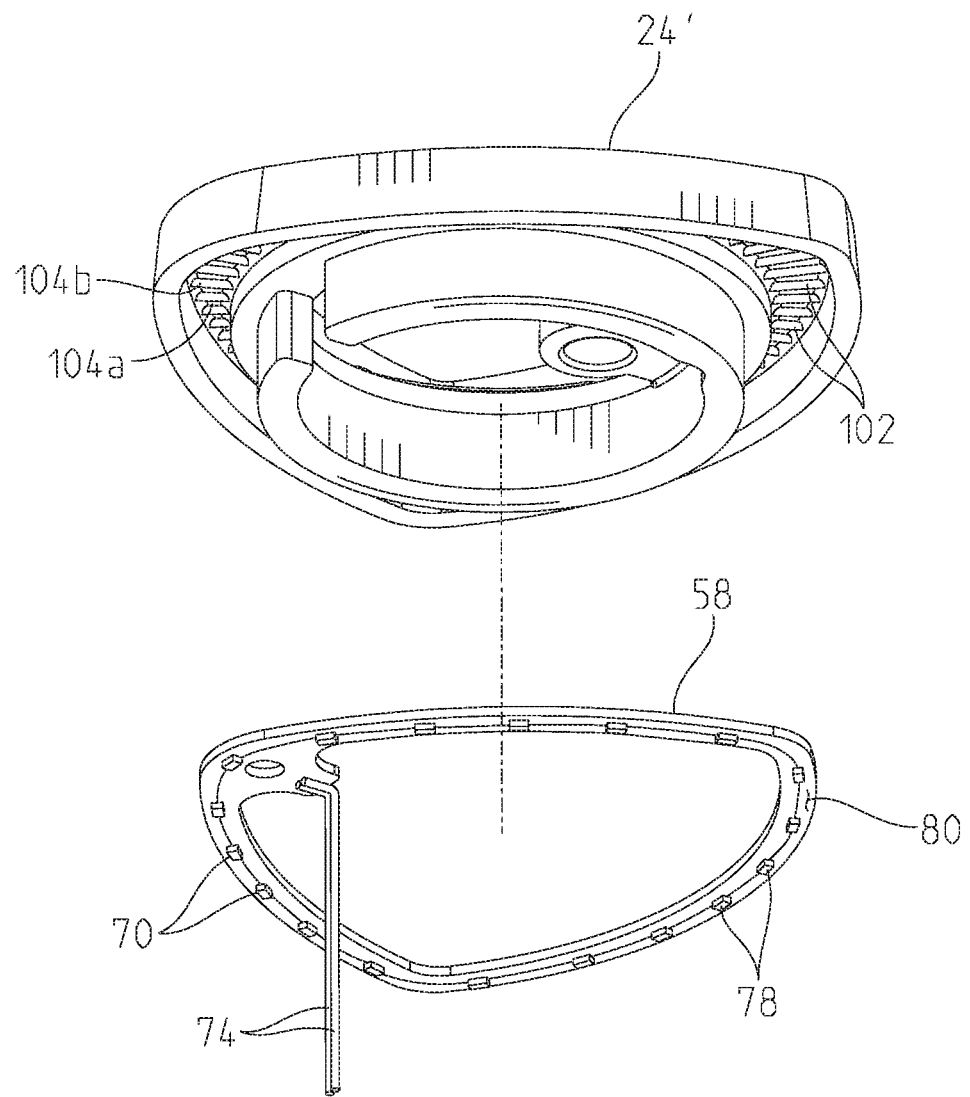
FIG. 9 is a perspective view of a further illustrative base co-operating with the substrate of FIG. 5.
Figure 10:
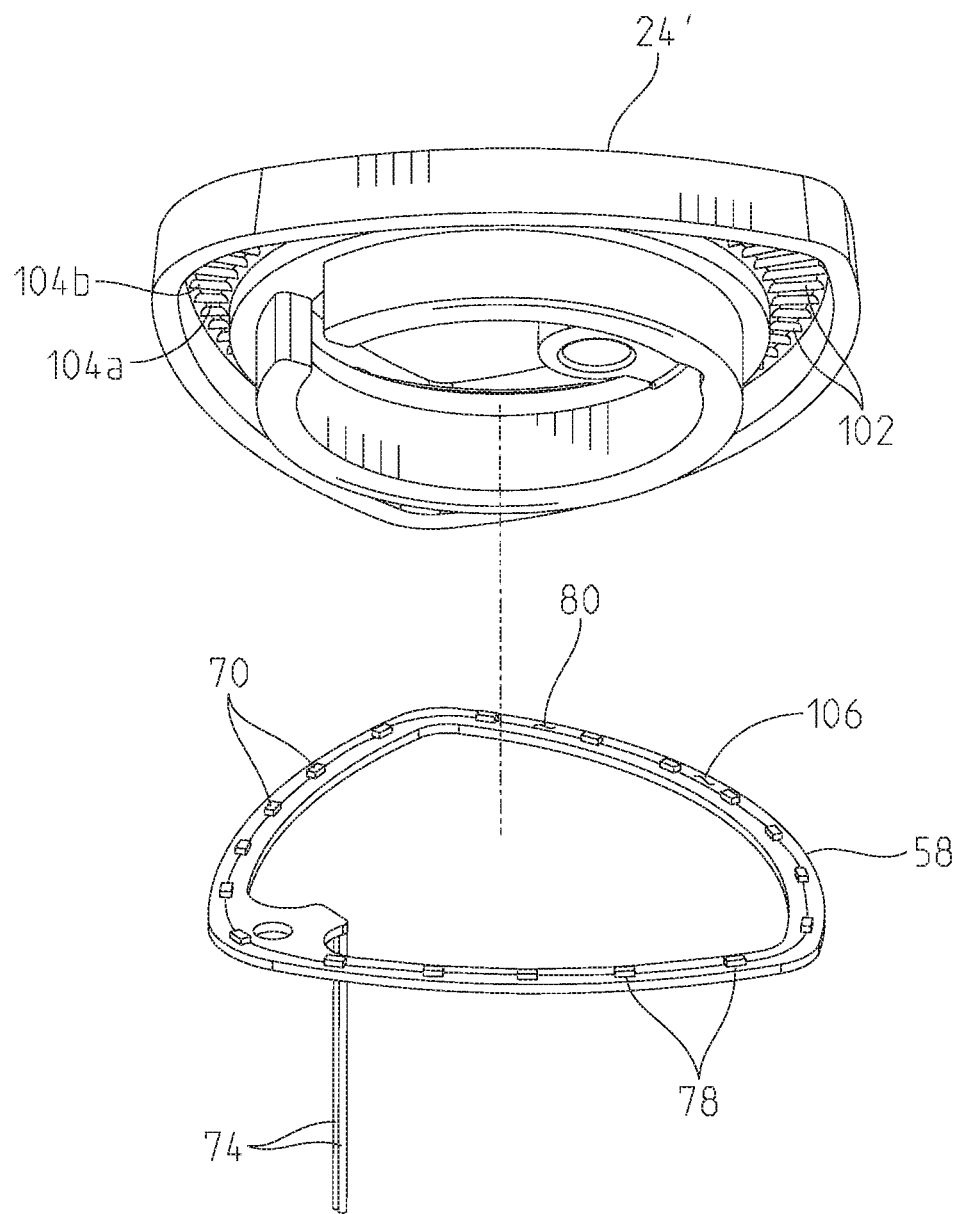
FIG. 10 is a perspective view of a further illustrative substrate co-operating with the base of FIG. 9.

With reference to the further illustrative embodiment of FIG. 9, the lower surface 48 of the upper wall 36 of the base 24' may include a plurality of deflectors or vanes 102 including opposing angled surfaces 104a and 104b configured to facilitate reflection of light from the light emitting diodes 78. The angled surfaces 104a and 104b cooperate with the diffuser 26 to assist in dispersing light "hot spots". As shown in the further illustrative embodiment of FIG. 10, the light emitting diodes 78 may be positioned on an upper surface 106 of the substrate 58 to direct light upwardly toward the lower surface 48' of the upper wall 36 of the base 24'. In other illustrative embodiments, the light emitting diodes 78 may be oriented to direct light in other directions (such as laterally).

A further illustrative embodiment faucet 110 is shown in FIGS. 11-17 as including many similar components as illustrative faucet 10 detailed above. In the following description, similar components between illustrative faucets 10 and 110 will be identified with like reference numbers.

Figure 11:
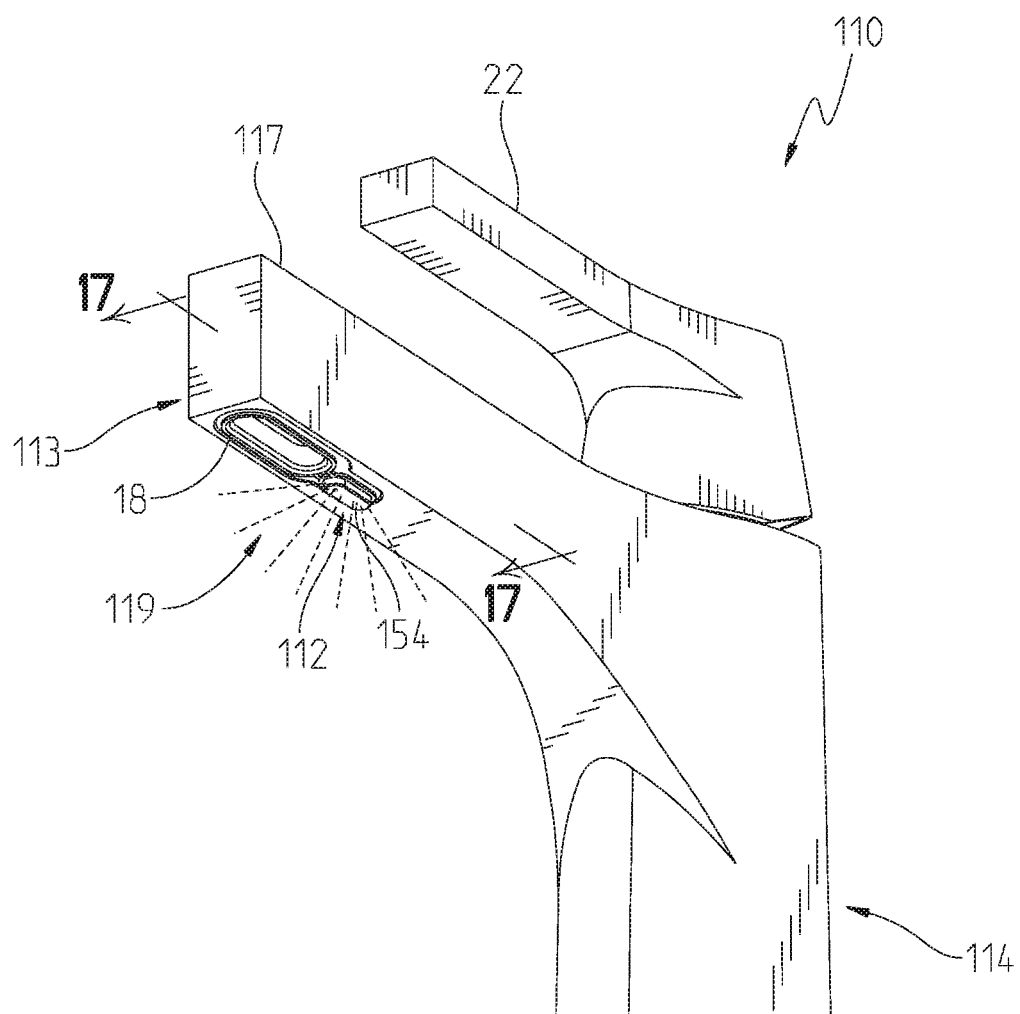
FIG. 11 is a perspective view of a further illustrative faucet.
Figure 12:
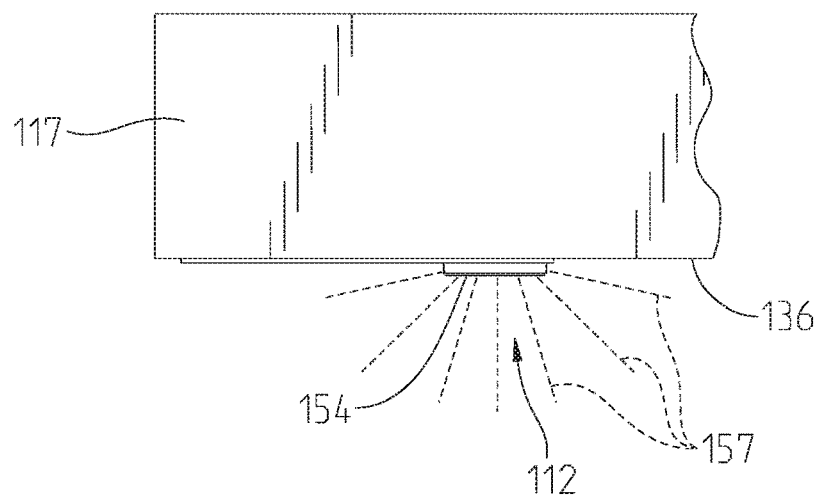
FIG. 12 is a partial side elevational view of the delivery spout of the faucet of FIG. 11.
Figure 13:
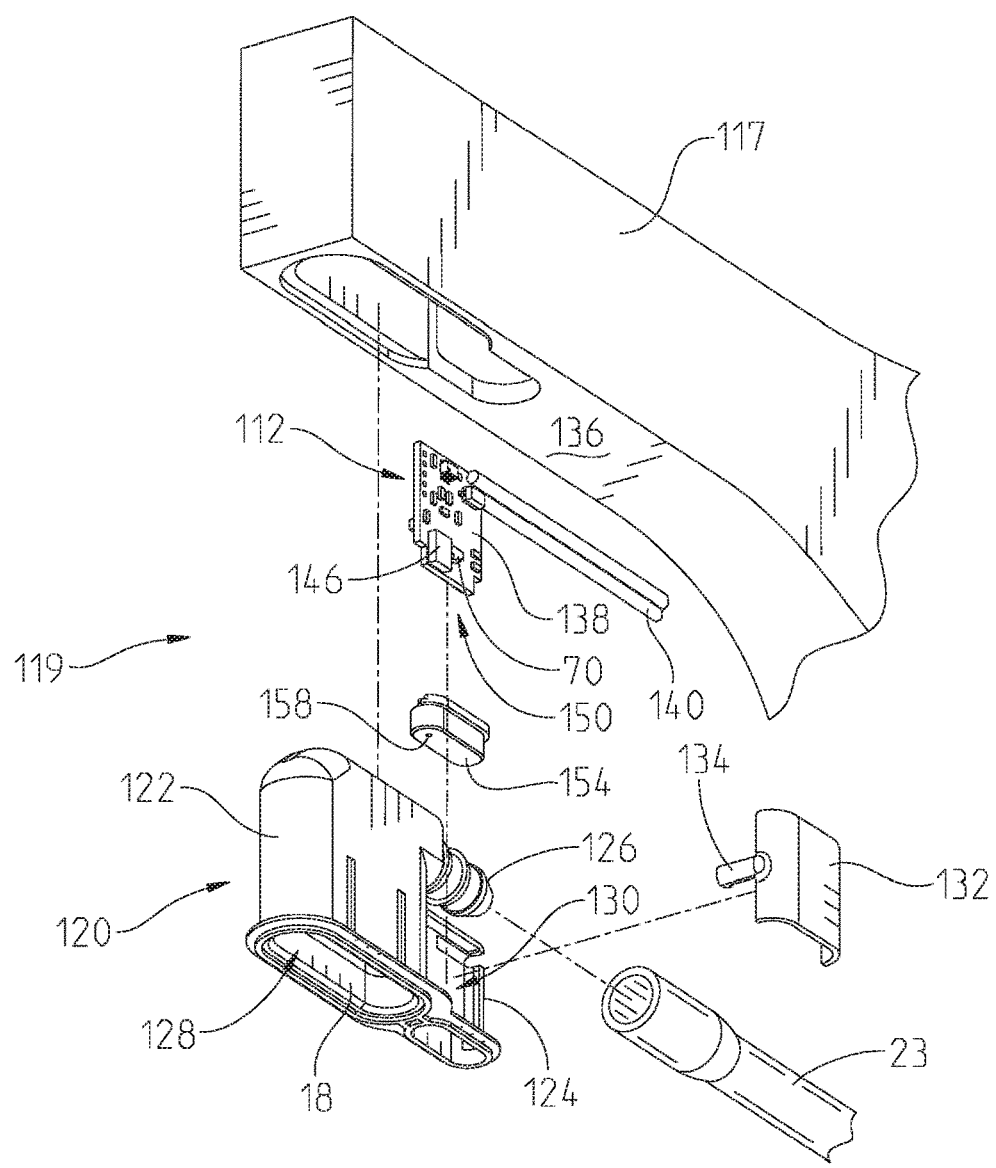
FIG. 13 a partially exploded perspective view of the delivery spout of FIG. 12.
Figure 14:
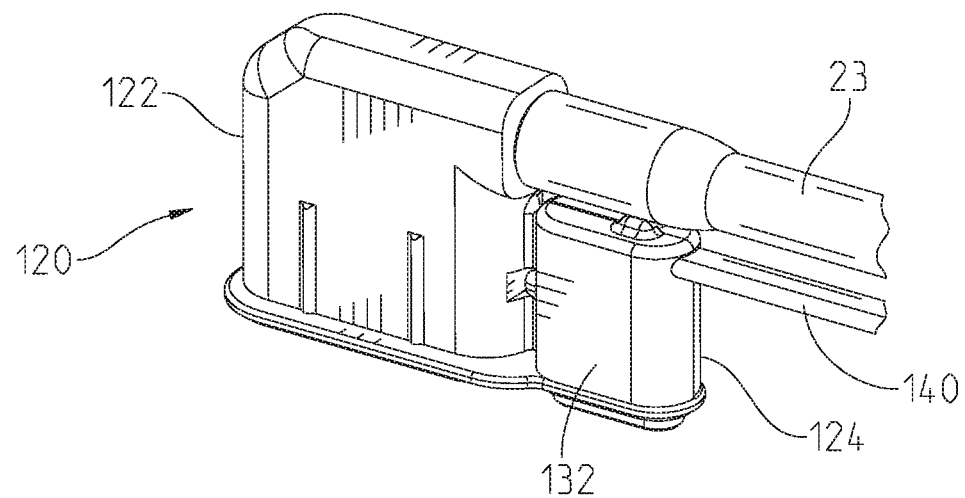
FIG. 14 is a top perspective view of the outlet assembly of FIG. 13.
Figure 15:
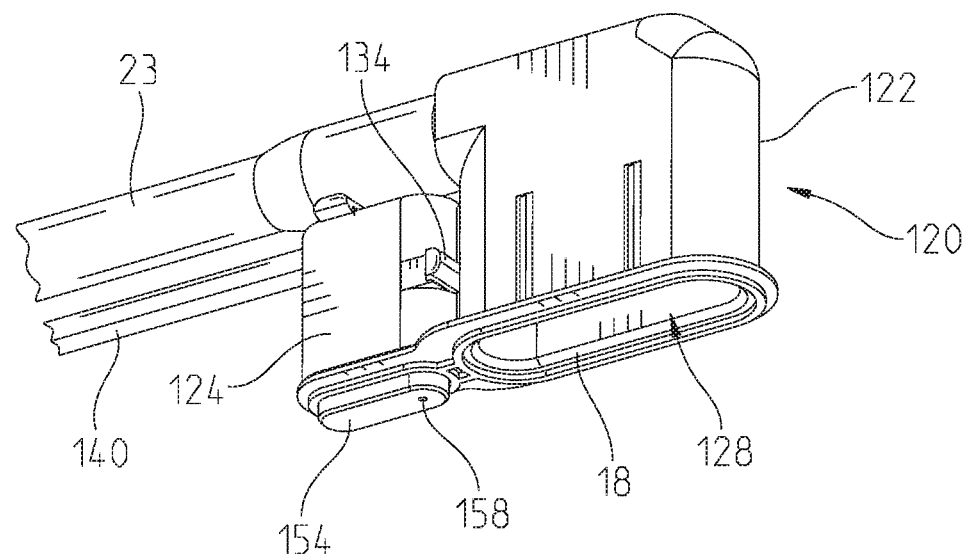
FIG. 15 is a bottom perspective view of the outlet assembly of FIG. 13.

With reference to FIGS. 11-13, an illustrative illumination device 112 is operably coupled to an outlet portion 113 defined by a faucet body, illustratively a cantilevered portion 117 of a delivery spout 114. More particularly, an outlet assembly 119 is supported by the outlet portion 113 of the delivery spout 114. The outlet assembly 119 illustratively includes an outlet housing 120 including a first portion 122 defining the water outlet 18, and a second portion 124 supporting the illumination device 112. The outlet housing 120 may be formed of a molded polymer.

The first portion 122 of the housing 120 includes an inlet defined by a barbed fitting 126. The water outlet tube 23 receives the fitting 126 to provide fluid communication with an internal fluid chamber 128. A conventional aerator (not shown) may be received by a lower portion of the chamber 128 to define the water outlet 18.

A receiving chamber 130 is defined between the second portion 124 of the housing 120 and a cover 132. The cover 132 includes couplers, such as snap fingers 134, to secure the cover 132 to the housing 120. An upper portion of the illumination device 112 is supported within the receiving chamber 130, while a lower portion of the illumination device 112 extends below a lower surface 136 of the cantilevered portion 117 of the delivery spout 114. More particularly, a substrate or support, illustratively a printed circuit board (pcb) 138, is coupled within the receiving chamber 130. As further detailed herein, cables 140 extend within the interior of the delivery spout 114 to below the sink deck 30 (FIG. 1) for electrically coupling the printed circuit board 138 to other electrical components.

Figure 16:
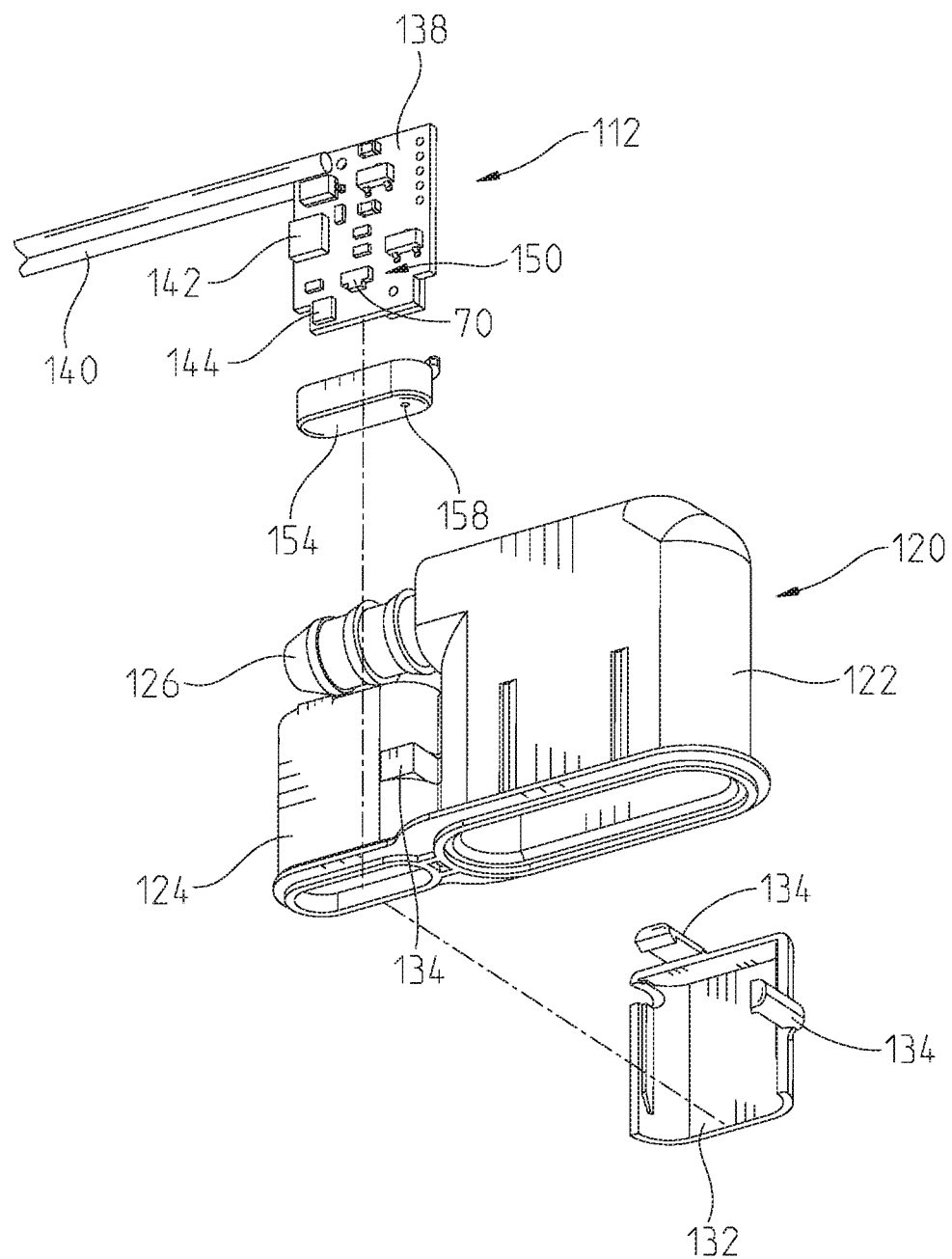
FIG. 16 is a partially exploded perspective view of the outlet assembly of FIG. 14.
Figure 17:
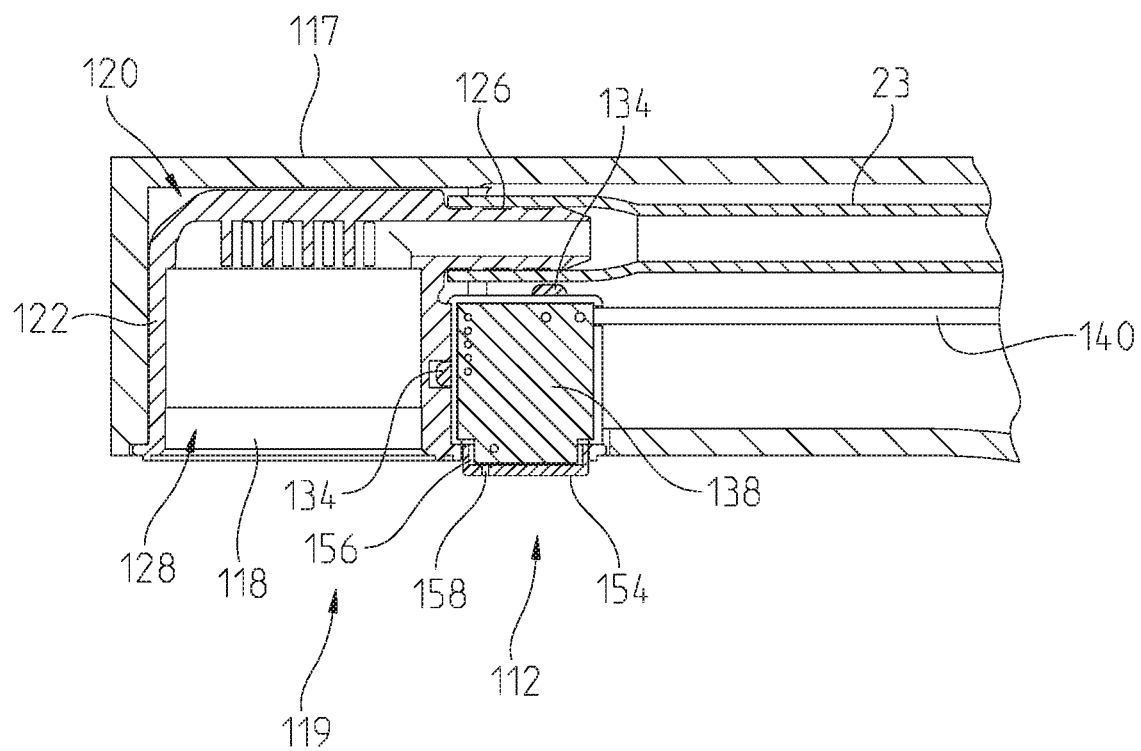
FIG. 17 is a cross-sectional view taken along line 17-17 of FIG. 11.

With reference to FIGS. 13 and 16, a controller 142, a first sensor (e.g., a light sensor 144), and a second sensor (e.g., an acoustic sensor 146) may be coupled to the printed circuit board 138. A light assembly 150 may include light emitters 70 (e.g., light emitting diodes) illustratively supported on opposing right and left surfaces 152*a* and 152*b* of the printed circuit board 138. The sensors 144, 146 and the light emitters 70 are in electrical communication with the controller 142, illustratively through electrically conductive traces formed on the printed circuit board 138. A translucent lens or diffuser 154 is coupled to a lower end of the printed circuit board 138 to direct light from the light emitters 70. The lens 154 is illustratively formed from a translucent material (e.g., an acrylic or polymer). The lens 154 illustratively includes an upwardly facing recess 156 to receive the light emitters 70 (FIG. 17). Illustratively, the lens 154 extends below the lower surface 136 of the cantilevered portion 117 of the delivery spout 114. As such, light emitted from the light emitters 70 illustratively extends both horizontally outwardly and vertically downwardly from the lens 154 (as shown by hidden lines 157 in FIG. 12).

With reference to FIGS. 13 and 17, an opening or recess 158 is illustratively formed in the lower surface of the lens 154 to facilitate transmission of sound to the acoustic sensor 146. In order to prevent water from entering the outlet housing 120, the recess 158 may be a small thru-hole (e.g., having a diameter of approximately 0.010 inches), or a blind recess.

Figure 18:
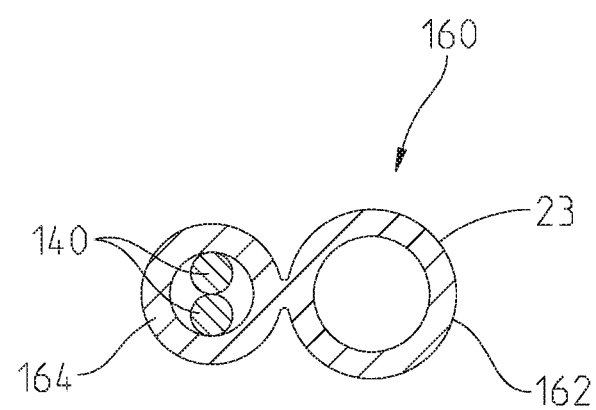
FIG. 18 is a cross-sectional view of an illustrative tube assembly coupled to the outlet assembly of FIG. 17.

FIG. 18 shows an illustrative tube assembly 160 coupled to the outlet housing 120. The tube assembly 160 includes a first tubular portion 162 extending parallel with a second tubular portion 164. The tube assembly 160 may be formed of a co-extruded polymer defining a "figure 8" in cross-section. Illustratively, the first tubular portion 162 defines the water outlet tube 23, while the second tubular portion 164 receives the cables 140.

Figure 19:
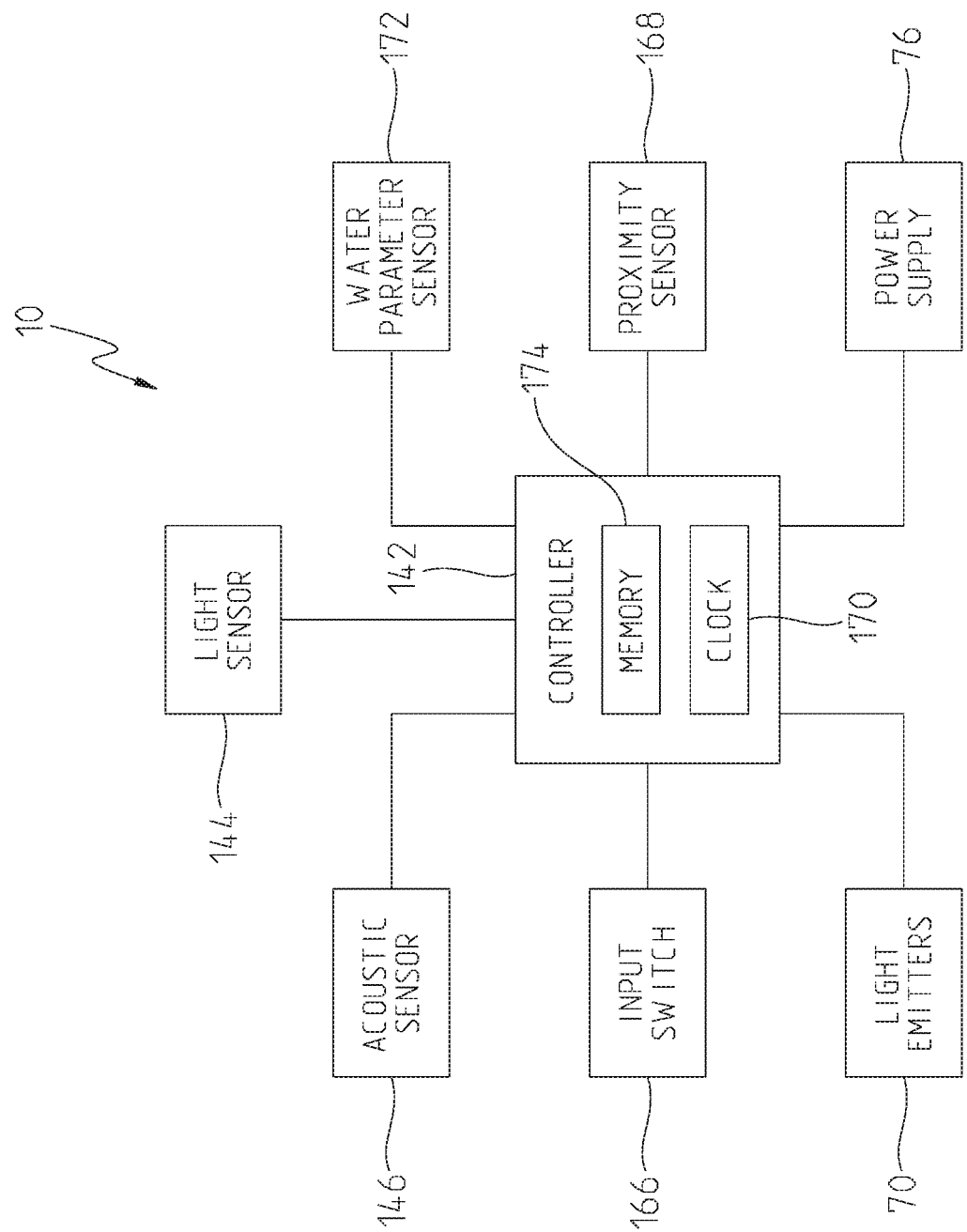
FIG. 19 is a block diagram of various components of the illustrative faucets of FIGS. 1 and 11.

With reference to FIG. 19, the controller 142 may control operation of the light emitters 70 of the light assembly 28, 150. In one illustrative embodiment, a manual input switch 166 may be operated by a user to activate and deactivate the light emitters 70. Alternatively, a proximity sensor 168 (such as an infrared (IR) sensor and/or a capacitive sensor) may detect the presence of a person within proximity of the faucet 10, 10', 110 and activate the light emitters 70 in response thereto. Alternatively, the acoustic sensor 146 (e.g., a microphone) may activate and/or deactivate the light emitters 70 in response to detected sound. The acoustic sensor 146 may compare audio measurements over time to establish a baseline value to account for (i.e., filter) background noise.

In another illustrative embodiment, the controller 142 may include a clock or timer 170 that activates and deactivates the light emitters 70 at preselected times and/or for preselected durations (e.g., activated for 8 hours after power is first supplied to the controller 142, followed by being deactivated for 16 hours, etc.).

In yet other illustrative embodiments, a water parameter sensor 172 may be in communication with the controller 142. For example, a water temperature sensor may be configured to detect the temperature of water supplied to the outlet 18 and provide a signal to the controller 142. A representation of the detected water temperature may then be provided by the light emitters 70. For example, the light emitters 70 may emit light that transitions from blue to red as the detected temperature increases from cold to hot, and emit light that transitions from red to blue as the detected temperature decreases from hot to cold.

In certain illustrative embodiments, the light sensor 144 may be supported by the printed circuit board 138 and in electrical communication with the controller 142 to detect ambient (e.g., room) light proximate to the faucet 10, 10', 110. Illustratively, the light sensor 144 may comprise a photo resistor configured to detect the intensity of ambient light. In one illustrative embodiment, the controller 142 activates the light emitters 70 when light in the room, as detected by the light sensor 144, is below a predetermined value (e.g., lux) stored in a memory 174 of the controller 142. The controller 142 may deactivate the light emitters 70 when light in the room, as detected by the light sensor 144, is at least as great as a predetermined value (e.g., lux).

In another illustrative embodiment, once the light in the room, as detected by the first sensor (e.g., the light sensor 144), is below a predetermined value (e.g., lux) stored in the memory 174 of the controller 142, then the second sensor (e.g., the acoustic sensor 146 and/or the proximity sensor 168) is enabled or turned on (i.e., "wakes up"). If either the enabled acoustic sensor 146 detects sound at least as great as a predetermined threshold, or the enabled proximity sensor 168 detects a user (e.g., motion at least as great as a predetermined threshold), then the controller 142 activates the light emitters 70. Once the light in the room, as detected by the light sensor 144, is at least as great as the predetermined value (e.g., lux), then the second sensor (e.g., the acoustic sensor 146 and/or the proximity sensor 168) may be disabled or turned off (i.e., enters a "sleep mode"). The controller 142 may also deactivate the light emitters 70 when the light detected by the light sensor 144 is at least as great as the predetermined value (e.g., lux), and/or when the light emitters 70 have been active for a predetermined time (e.g., 2 minutes) as measured by the timer 170. In this manner, power 76 (e.g., batteries) is conserved by deactivating the second sensor 146, 168 when ambient light near the faucet 10, 10', 110 is above the threshold value.

Although the invention has been described in detail with reference to certain preferred embodiments, variations and modifications exist within the spirit and scope of the invention as described and defined in the following claims.

The invention claimed is:

1. An illumination device for a faucet, the illumination device comprising:
a base formed of an opaque material, the base including an inner wall, an outer wall laterally spaced from the inner wall, an upper wall extending between the inner wall and the outer wall, and a recess defined between the inner wall, the outer wall and the upper wall a delivery spout operably coupled to said base of said faucet;
a diffuser formed of a translucent material, the diffuser positioned laterally outwardly from the inner wall of the base and positioned longitudinally below the outer wall of the base;
a substrate positioned within the recess intermediate the base and the diffuser;
a plurality of light emitters supported by the substrate;
at least one deflector supported by the upper wall of the base to reflect light from the plurality of light emitters; and
wherein the diffuser is configured to diffuse light from the light emitters laterally outwardly.

2. The illumination device of claim 1, wherein the substrate comprises a printed circuit board including a plurality of electrically conductive traces coupled to the plurality of light emitters.

3. The illumination device of claim 2, further comprising an electrical wire coupled to the conductive traces and a power supply.

4. The illumination device of claim 1, wherein each of the plurality of light emitters comprises a light emitting diode.

5. The illumination device of claim 4, wherein the light emitting diodes are spaced apart to define a closed loop of continuous light diffused by the diffuser.

6. The illumination device of claim 1, wherein the base further includes an upper surface defined by the upper wall for supporting said delivery spout, and a locator wall extending upwardly from the upper surface for locating said delivery spout.

7. An illumination device for a faucet, the illumination device comprising:
a base formed of an opaque material, the base including an inner wall, an outer wall laterally spaced from the inner wall, an upper wall extending between the inner wall and the outer wall, and a recess defined between the inner wall, the outer wall and the upper wall;
a diffuser formed of a translucent material, the diffuser positioned laterally outwardly from the inner wall of the base and positioned longitudinally below the outer wall of the base;
a substrate positioned within the recess intermediate the base and the diffuser;
a plurality of light emitters supported by the substrate;
wherein the diffuser is configured to diffuse light from the light emitters laterally outwardly;
wherein the base further includes an upper surface defined by the upper wall for supporting a delivery spout, and a locator wall extending upwardly from the upper surface for locating the delivery spout; and
an escutcheon, the inner wall of the base being supported by the escutcheon.

8. The illumination device of claim 1, further comprising a sensor configured to detect the presence of a user and generate an activation signal, the plurality of light emitters being activated in response to the activation signal.

9. An illumination device for a faucet, the illumination device comprising:
a base formed of an opaque material, the base including an inner wall, an outer wall laterally spaced from the inner wall, an upper wall extending between the inner wall and the outer wall, and a recess defined between the inner wall, the outer wall and the upper wall;
a diffuser formed of a translucent material, the diffuser positioned laterally outwardly from the inner wall of the base and positioned longitudinally below the outer wall of the base;
a substrate positioned within the recess intermediate the base and the diffuser;
a plurality of light emitters supported by the substrate;
wherein the diffuser is configured to diffuse light from the light emitters laterally outwardly;
a first sensor configured to detect ambient light and generate a first signal in response to detected light intensity above a predetermined value;
a second sensor configured to be enabled in response to the first signal and, when enabled, to detect the presence of a user and generate a second signal; and
wherein the plurality of light emitters are activated in response to the second signal.

10. The illumination device of claim 9, wherein the first sensor comprises a photo resistor, and the second sensor comprises an acoustic sensor.

11. The illumination device of claim 1, wherein the light emitters are configured to direct light longitudinally downwardly toward the diffuser.

12. A faucet comprising:
a faucet body;
a base formed of an opaque material, the base including an upper wall supporting the faucet body, and an outer shield extending downwardly from the upper wall;
a diffuser formed of a translucent material, the diffuser positioned laterally outwardly from the inner wall of the base and positioned longitudinally below the outer wall of the base;
a substrate supported by a lower surface of the upper wall of the base;
a plurality of light emitters supported by the substrate; and
a plurality of deflectors supported by the upper wall of the base, each of the deflectors including opposing angled surfaces to reflect light from the plurality of light emitters.

13. A faucet comprising:
a faucet body;
a base formed of an opaque material, the base including an upper wall supporting the faucet body, and an outer shield extending downwardly from the upper wall;
a diffuser formed of a translucent material, the diffuser positioned laterally outwardly from the inner wall of the base and positioned longitudinally below the outer wall of the base;
a substrate supported by a lower surface of the upper wall of the base;
a plurality of light emitters supported by the substrate; and
an escutcheon supporting the base.

14. The faucet of claim 12, wherein the substrate comprises a printed circuit board including a plurality of electrically conductive traces coupled to the plurality of light emitters.

15. The faucet of claim 14, further comprising an electrical wire coupled to the conductive traces and a power supply.

16. The faucet of claim 12, wherein each of the plurality of light emitters comprises a light emitting diode.

17. The faucet of claim 16, wherein the light emitting diodes are spaced apart to define a closed loop of continuous light diffused by the diffuser.

18. The faucet of claim 12, wherein the faucet body comprises a delivery spout, and the base further includes a locator wall extending upwardly from the upper surface and received within the spout for locating the spout.

19. The faucet of claim 12, further comprising a sensor configured to detect the presence of a user and generate an activation signal, the plurality of light emitters being activated in response to such activation signal.

20. A faucet comprising:
a faucet body;
a base formed of an opaque material, the base including an upper wall supporting the faucet body, and an outer shield extending downwardly from the upper wall;
a diffuser formed of a translucent material, the diffuser positioned laterally outwardly from the inner wall of the base and positioned longitudinally below the outer wall of the base;
a substrate supported by a lower surface of the upper wall of the base;
a plurality of light emitters supported by the substrate;
a first sensor configured to detect ambient light and generate a first signal in response to detected light intensity above a predetermined value;
a second sensor configured to be enabled in response to the first signal and, when enabled, to detect the presence of a user and generate a second signal; and
wherein the plurality of light emitters are activated in response to the second signal.

21. The faucet of claim 20, wherein the first sensor comprises a photo resistor, and the second sensor comprises an acoustic sensor.

22. A faucet comprising:
a faucet body;
a substrate supported by the faucet body;
at least one light emitter supported by the substrate;
a first sensor configured to detect ambient light and generate a first signal in response to detected light intensity above a predetermined value;
a second sensor configured to be enabled in response to the first signal and, when enabled, to detect the presence of a user and generate a second signal; and
wherein the at least one light emitter is activated in response to the second signal.

23. The faucet of claim 22, wherein the first sensor and the second sensor are supported by the substrate.

24. The faucet of claim 22, wherein the first sensor comprises a photo resistor, and the second sensor comprises an acoustic sensor.

25. The faucet of claim 22, further comprising:
a base formed of an opaque material, the base including an upper wall supporting the faucet body, and an outer shield extending downwardly from the upper wall; and
a diffuser formed of a translucent material, the diffuser positioned laterally outwardly from the inner wall of the base and positioned longitudinally below the outer wall of the base.

26. The faucet of claim 22, wherein the substrate comprises a printed circuit board including a plurality of electrically conductive traces coupled to the at least one light emitter.

27. The faucet of claim 22, wherein the at least one light emitter comprises a light emitting diode.

28. The faucet of claim 22, wherein the faucet body comprises a delivery spout, and the base further includes a locator wall extending upwardly from the upper surface and received within the spout for locating the spout.

29. The faucet of claim 22, further comprising an outlet housing including a first portion defining a water outlet, and a second portion receiving an upper portion of the substrate.

30. The faucet of claim 29, wherein the faucet body includes a delivery spout having a cantilevered portion with a lower surface and receiving the outlet housing.

31. The faucet of claim 30, further comprising a diffuser extending below the lower surface of the cantilevered portion of the delivery spout, the diffuser configured to direct light from the at least one light emitter in both vertical and horizontal directions.

32. The illumination device of claim 1, wherein the at least one deflector includes a plurality of deflectors, each of the deflectors including opposing angled surfaces.

* * * * *